United States Patent
Hsu et al.

(10) Patent No.: US 7,523,438 B2
(45) Date of Patent: Apr. 21, 2009

(54) METHOD FOR IMPROVED LITHOGRAPHIC PATTERNING UTILIZING OPTIMIZED ILLUMINATION CONDITIONS AND HIGH TRANSMISSION ATTENUATED PSM

(75) Inventors: Michael Hsu, Taipei (TW); Stephen Hsu, Fremont, CA (US); Thomas Laidig, Point Richmond, CA (US); Douglas Van Den Broeke, Sunnyvale, CA (US); Jang Fung Chen, Cupertino, CA (US)

(73) Assignee: ASML Masktools B.V., Ah Veldhoven (NL)

( * ) Notice: Subject to any disclaimer, the term of this patent is extended or adjusted under 35 U.S.C. 154(b) by 445 days.

(21) Appl. No.: 11/108,665

(22) Filed: Apr. 19, 2005

(65) Prior Publication Data

US 2005/0186491 A1    Aug. 25, 2005

Related U.S. Application Data

(62) Division of application No. 10/222,972, filed on Aug. 19, 2002, now Pat. No. 6,951,701.

(60) Provisional application No. 60/313,487, filed on Aug. 21, 2001.

(51) Int. Cl.
G06F 17/50 (2006.01)
G03F 1/00 (2006.01)

(52) U.S. Cl. .................. 716/21; 716/19; 430/5

(58) Field of Classification Search .......... 716/19, 716/21; 700/108; 430/5; 355/53, 67, 71, 355/77; 250/559.04
See application file for complete search history.

(56) References Cited

U.S. PATENT DOCUMENTS 5,300,786 A    4/1994    Brunner et al.

(Continued)

FOREIGN PATENT DOCUMENTS

EP    0 969 327 A2    1/2000

(Continued)

OTHER PUBLICATIONS

Wong et al.; "The mask error factor in optical lithography"; May 2000; Semiconductor Manufacturing, IEEE Transactions on; vol. 13, Issue 2, pp. 235-242.*

(Continued)

*Primary Examiner*—Helen Rossoshek
(74) *Attorney, Agent, or Firm*—Pillsbury Winthrop Shaw Pittman LLP

(57) ABSTRACT

A method for optically transferring a lithographic pattern corresponding to an integrated circuit utilizing a high transmission attenuated phase-shift mask onto a semiconductor substrate by use of an optical exposure tool. The method comprising the steps of generating a diffraction pattern corresponding to the lithographic pattern, where the diffraction pattern indicates a plurality of spatial frequency components corresponding to the lithographic pattern; determining which of the spatial frequency components need to be captured by a lens in the optical exposure tool in order to accurately reproduce the lithographic pattern; determining a set of illumination conditions required for the optical exposure tool to capture the spatial frequency components necessary for accurately reproducing the lithographic pattern; and illuminating the high transmission attenuated phase-shift mask with this set of illumination conditions.

10 Claims, 12 Drawing Sheets

U.S. PATENT DOCUMENTS

| | | | |
|---|---|---|---|
| 5,680,588 A | 10/1997 | Gortych et al. | |
| 5,805,290 A | 9/1998 | Ausschnitt et al. | |
| 5,965,309 A | 10/1999 | Ausschnitt et al. | |
| 6,094,305 A | 7/2000 | Shiraishi | |
| 6,312,854 B1* | 11/2001 | Chen et al. | 430/5 |
| 6,388,736 B1* | 5/2002 | Smith et al. | 355/53 |
| 6,396,569 B2* | 5/2002 | Zheng et al. | 355/77 |
| 6,480,263 B1* | 11/2002 | Smith | 355/71 |
| 6,482,555 B2* | 11/2002 | Chen et al. | 430/5 |
| 6,525,806 B1* | 2/2003 | Smith | 355/71 |
| 6,541,167 B2* | 4/2003 | Petersen et al. | 430/5 |
| 6,563,566 B2 | 5/2003 | Rosenbluth et al. | |
| 6,623,895 B2* | 9/2003 | Chen et al. | 430/5 |
| 6,660,436 B1* | 12/2003 | Chen et al. | 430/5 |
| 6,818,389 B2* | 11/2004 | Fritze et al. | 430/5 |
| 6,846,595 B2* | 1/2005 | Smith | 430/5 |
| 6,909,105 B1* | 6/2005 | Heintzmann et al. | 250/559.04 |
| 6,980,872 B2* | 12/2005 | Kano et al. | 700/108 |
| 7,023,522 B2* | 4/2006 | Sugita et al. | 355/53 |
| 7,030,966 B2* | 4/2006 | Hansen | 355/67 |
| 7,180,576 B2* | 2/2007 | Hansen | 355/67 |
| 7,225,041 B2* | 5/2007 | Kano et al. | 700/108 |
| 2002/0015899 A1* | 2/2002 | Chen et al. | 430/5 |
| 2002/0048708 A1* | 4/2002 | Chen et al. | 430/5 |
| 2002/0152452 A1* | 10/2002 | Socha | 716/21 |
| 2003/0112421 A1* | 6/2003 | Smith | 355/71 |
| 2005/0136340 A1* | 6/2005 | Baselmans et al. | 430/5 |

FOREIGN PATENT DOCUMENTS

| | | |
|---|---|---|
| JP | 4-204737 | 7/1992 |
| JP | 05-067558 | 3/1993 |
| JP | 8-335552 | 12/1996 |
| JP | 2000-21718 | 1/2000 |
| JP | 2000-21721 | 1/2000 |
| JP | 2000-21722 | 1/2000 |
| JP | 2000-21762 | 1/2000 |
| JP | 2000-40656 | 2/2000 |
| JP | 2000-252199 | 9/2000 |

OTHER PUBLICATIONS

Nakao et al.; "0.32 μm pitch on-gird random line pattern formation by dense dummy pattern and double exposure in KrF wavelength"; Jul. 6-8, 1999; Microprocesses and Nanotechnology Conference, 1999. Digest of Papers. Microprocesses and Nanotechnology '99; pp. 98-99.*

Yeung, M.S.; "Measurement of wave-front aberrations in high-resolution optical lithographic systems from printed photoresist patterns"; Feb. 2000; Semiconductor Manufacturing, IEEE Transactions on; vol. 13, Issue 1, pp. 24-33.*

Alan E. Rosenbluth et al., "Optimum Mask and Source Patterns to Print a Given Shape" SPIE v.4346—Optical Microlithography XIV, p. 1-17.

Schellenberg, F. et al. "Optimization of Real Phase Mask Performance", Proceedings of the SPIE, SPIE, Bellingham, VA, vol. 1604, Sep. 25, 1991 pp. 274-296, XP008018616, ISSN: 0277-786X.

A. Grassmann et al., "Aerial Image Studies of an Advanced Deep-UV Exposure System", Microelectronic Engineering 23 (1994) pp. 155-158.

R. A. Budd et al., A New Mask Evaluation Tool, the Microlithography Simulation Microscope Aerial Image Measurement System, SPIE—The International Society for Optical Engineering, Optical/Laser Microlithography VII, vol. 2197, Mar. 1994, p. 530-540.

Hye-Keun Oh et al., "Optimum combination of source, mask and filter for better lithographic performance", SPIE—The International Society for Optical Engineering, Optical/Laser Microlithography VIII, SPIE vol. 2440, p. 838-849 (1995).

Christopher J. Progler et al., "Merit functions for lithographic lens design", J. Vac. Sci. Techno. B. 14(6), p. 3714-3718, Nov./Dec. 1996.

B. P. Mathur et al., "Quantitative Evaluation of Shape of Image on Photoresist of Square Apertures," IEEE Transactions on Electron Devices, vol. 35, No. 3, Mar. 1998.

E. Barouch, et al., "Illuminator optimization for projection printing", SPIE Conference on Optical Microlighography XII, Mar. 1999, vol. 3679.

Nishrin Kachwala et al., "Imaging contrast improvement for 160 nm line features using sub resolution assist features with binary, 6% ternary atteunuated phase shift mask with process tuned resist", SPIE Conference on Optical Microlithography XII, Mar. 1999, SPIE vol. 3679, p. 55-67.

* cited by examiner

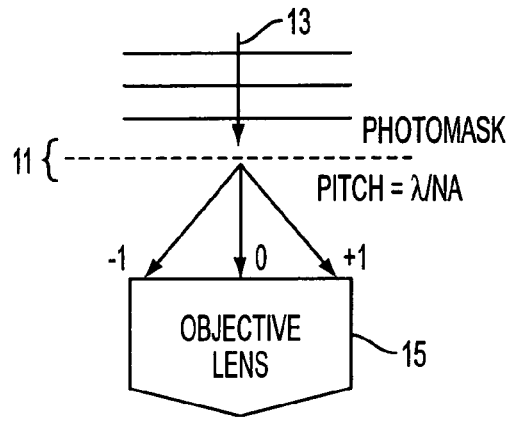
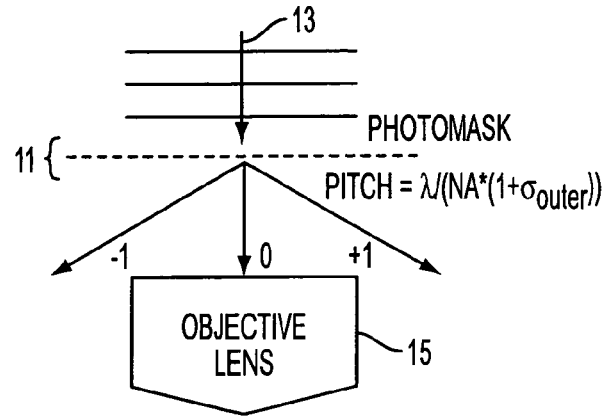
FIG. 1A  FIG. 1B
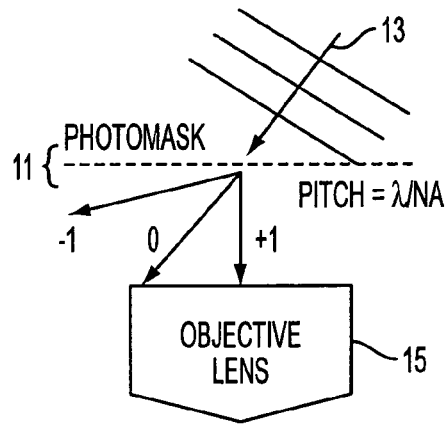
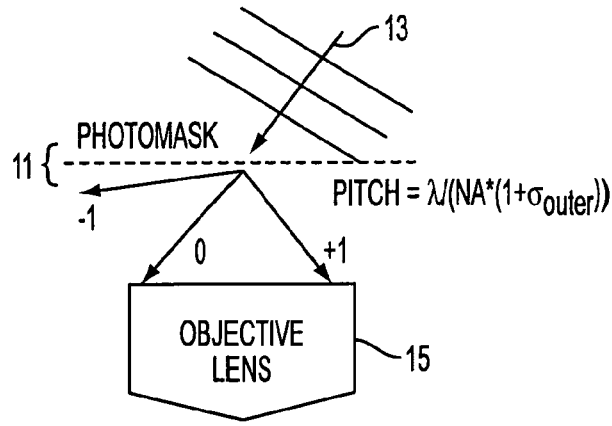
FIG. 1C  FIG. 1D

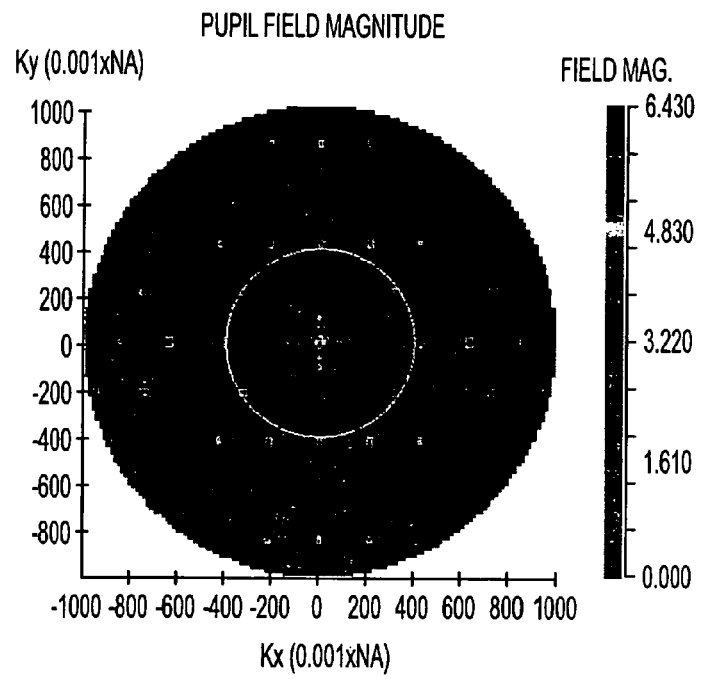
FIG. 17
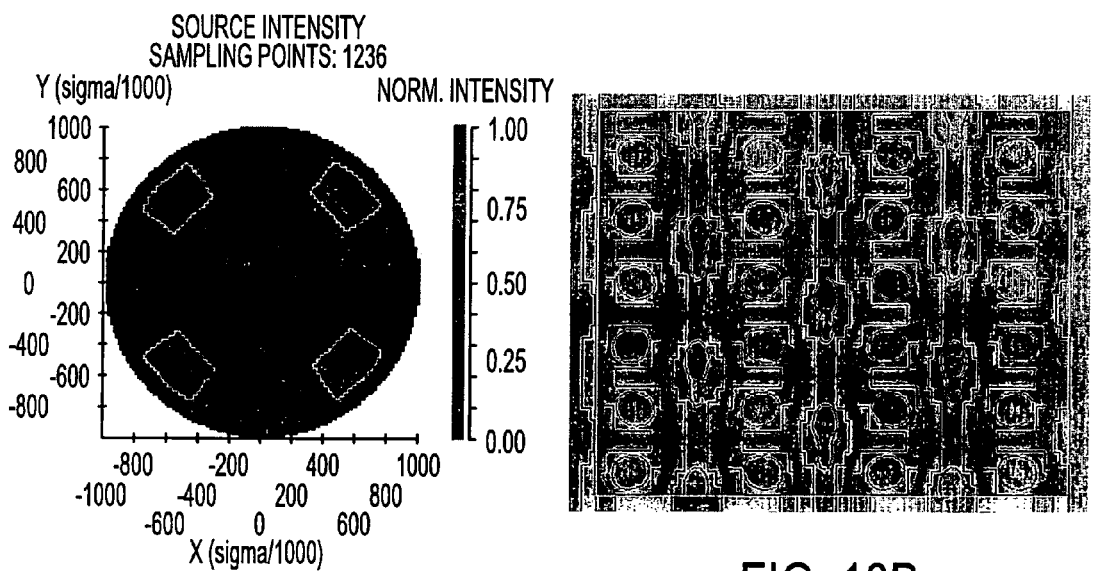
FIG. 18A
FIG. 18B

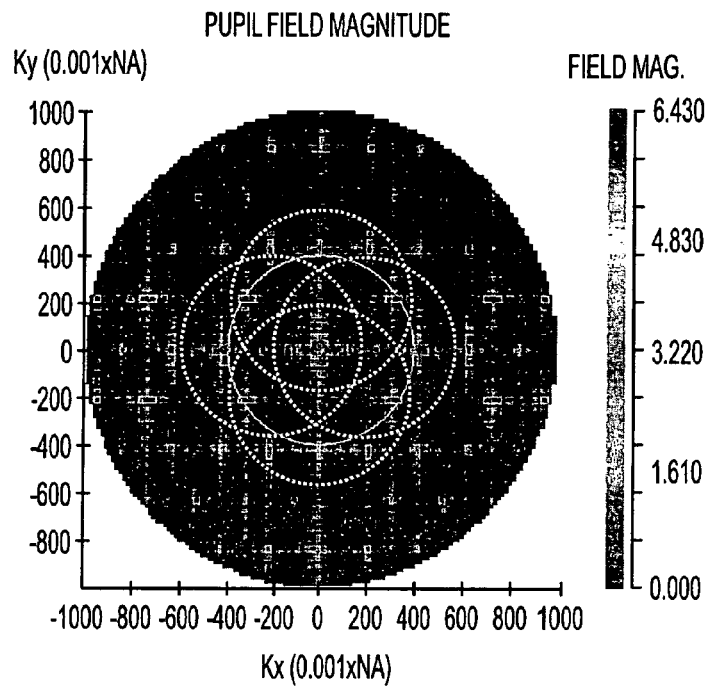
FIG. 19
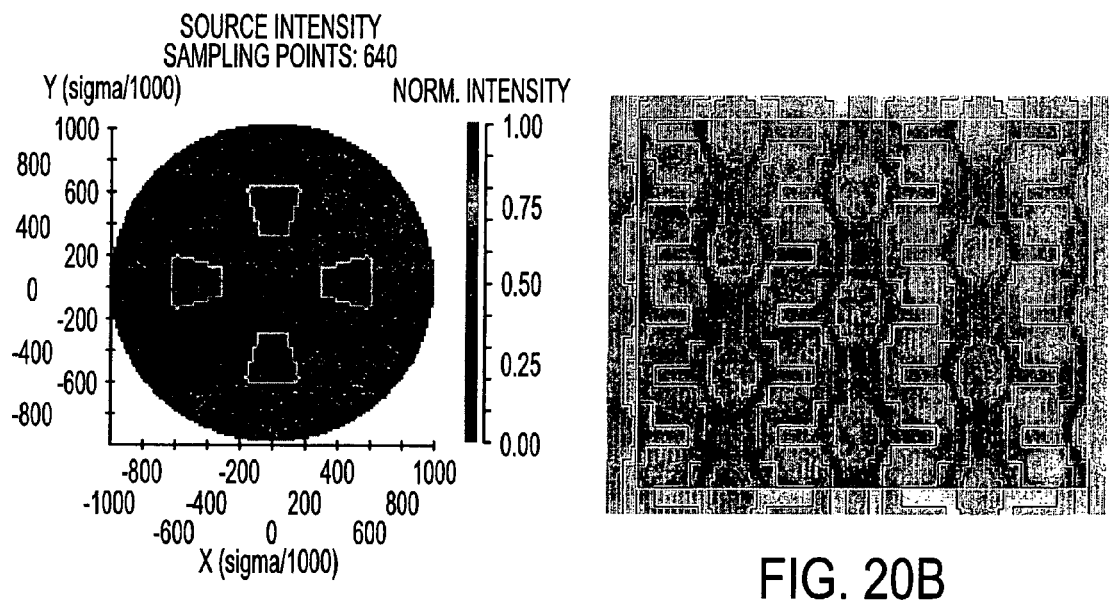
FIG. 20A
FIG. 20B

METHOD FOR IMPROVED LITHOGRAPHIC PATTERNING UTILIZING OPTIMIZED ILLUMINATION CONDITIONS AND HIGH TRANSMISSION ATTENUATED PSM

RELATED APPLICATION

This application is a divisional of U.S. application Ser. No. 10/222,972 filed on Aug. 19, 2002 now U.S. Pat. No. 6,951,701, which claims the benefit of the filing date of U.S. Provisional Application No. 60/313,487 filed Aug. 21, 2001 incorporated herein by reference in its entirety.

FIELD OF THE INVENTION

The present invention relates to an improved photolithography process, and more particularly to a method that allows for the printing of features having a pitch significantly less than the exposure wavelength and pitch ratios of near 1:1 (i.e., line to space ratios) utilizing multiple coherency optimized exposures and high transmission attenuated phase-shift masks (PSM). The present invention also relates to the use of the method in a lithographic projection apparatus, which generally comprises:
- a radiation system for supplying a projection beam of radiation;
- a support structure for supporting patterning means (e.g., mask), the patterning means serving to pattern the projection beam according to a desired pattern;
- a substrate table for holding a substrate; and
- a projection system for projecting the patterned beam onto a target portion of the substrate.

BACKGROUND OF THE INVENTION

Lithographic apparatus can be used, for example, in the manufacture of integrated circuits (ICs). In such a case, a mask utilized in the photolithography process may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be found, for example, in U.S. Pat. No. 6,046,792, which is incorporated herein by reference.

In a manufacturing process using a lithographic projection apparatus, the mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Of course, one of the goals in integrated circuit fabrication is to faithfully reproduce the original design on the wafer (via the mask). As the demand to image smaller and smaller features in the semiconductor manufacturing process has continued unabated, the limitations of optical lithography that were was once accepted have been exceeded repeatedly.

Several optical extension approaches have been proposed over the years, the most notable being the alternating aperture phase shift mask (alt-PSM) first published in the early 1980's. Limitations to alt-PSM practical applications, such as the ability to manufacture the reticles, phase conflicts, design restrictions, and reticle topography effects on the propagating electromagnetic field, have prevented this approach from widespread use in manufacturing. Variations of the alternating aperture phase shift reticle, including 60-120-180 degree multi-phase reticles, 90-270 phase reticles, and dual-trench processing, that to some extent correct for these types of problems, have been employed to some degree and have seen limited application in the wafer lithography process. However, in order to make the process viable for manufacturing, a two-reticle, complimentary alt-PSM has been adopted and is currently the most common method for implementing alt-PSM in actual production.

In such a complimentary alt-PSM approach, the critical gate geometries (i.e., the minimum feature size to be printed) are extracted from the design so that they can be imaged separately from the rest of the gate layer patterns. The gate patterns are imaged by using a "dark field" PSM reticle that has a window cut out on either side of each gate, with one of the windows being phase shifted by 180 degrees relative to the other, thereby giving the desired alternating aperture phase shifting across the gate geometry. A second binary reticle, which contains protection blocks in the areas where the gates are patterned, is used to expose the non-critical geometries and the field area that was not exposed during the first exposure. However, using such a two-exposure method comes at the cost of throughput, multiple reticles, first and second exposure overlay errors caused by stepper alignment and reticle placement errors, as well as imaging distortions that occur at the boundaries of the first and second exposures.

Even if such costs associated with the complimentary alt-PSM method in order to gain the resolution enhancement necessary to print sub-wavelength features are acceptable, very little benefit is achieved as far as reducing the minimum pitch that can be resolved. Specifically, it is preferable to use more coherent illumination ($\sigma<=0.30$) in order to obtain the highest resolution enhancement that results from the phase difference on either side of the gate pattern. If so, this can induce very strong proximity effects such as very severe corner rounding or fast and steep CD changes from near 1:1 pitch to isolated features. Both pose additional complications to the already difficult design challenges and further limit the practical implementation.

For other types of photomasks, excluding alt-PSM, the minimum gate pitch is limited to the wavelength ($\lambda$) of the imaging system divided by the numerical aperture (NA) of the lens or a $K_{pitch}$ of approximately 0.50. One way to overcome this pitch limitation is to print every other feature in a first exposure, so as to effectively double the pitch, and then with a second exposure print the features in between the features that were exposed with the first exposure. It is also possible to decompose the desired pattern in a more complex manner which results in two or more patterns where the minimum pitch has been increased to a point where it can be resolved, and where the result of imaging the patterns, one on top of the other, is the final desired pattern. This pattern decomposition strategy can be implemented using binary reticles. However, in such a decomposition method, there is no longer any resolution enhancement that comes from phase shifting. Moreover, the decomposition method has the same disadvantages as any other multiple exposure approach including throughput, multiple reticles, exposure overlay accuracy, and boundaries between the exposures.

Thus, current optical technology techniques continue to be limited in the smallest pitch that can be printed using a particular wavelength. This pitch, which is referred to as $k_{pitch}$, is defined as:

$$k_{pitch}=(\text{pitch}/2)*(NA/\text{lambda}),$$

where NA is the numerical aperture of the exposure system and lambda is the exposure wavelength. Indeed, current methods of optical lithography are limited to a $k_{pitch}$ of approximately 0.50.

As such, there is need for a photolithography method which allows for an improvement of the pitch resolution capabilities (i.e., a reduction in $k_{pitch}$) of currently available photolithography apparatus, and that overcomes the drawbacks associated with currently known techniques.

SUMMARY OF THE INVENTION

Accordingly, it is an object of the present invention to provide a lithography process that allows for an improvement of the pitch resolution capabilities (i.e., a reduction in $k_{pitch}$) of currently available photolithography apparatus, and that overcomes the drawbacks associated with the currently known techniques.

More specifically, the present invention relates to a method for optically transferring a lithographic pattern corresponding to an integrated circuit utilizing a high transmission attenuated phase-shift mask onto a semiconductor substrate by use of an optical exposure tool. The method comprising the steps of generating a diffraction pattern corresponding to the lithographic pattern, where the diffraction pattern indicates a plurality of spatial frequency components corresponding to the lithographic pattern; determining which of the spatial frequency components need to be captured by a lens in the optical exposure tool in order to accurately reproduce the lithographic pattern; determining a set of illumination conditions required for the optical exposure tool to capture the spatial frequency components necessary for accurately reproducing the lithographic pattern; and illuminating the high transmission attenuated phase-shift mask with this set of illumination conditions.

As described in further detail below, the present invention provides significant advantages over the prior art. Most importantly, the novel method of the present invention provides for optical extension using very high transmission attenuated PSM, novel illumination, innovative exposure techniques, and engineering of the diffraction pattern, so as to allow for an enhancement of pitch resolution capability. The method of the present invention enables the printing of features having a pitch much less than the exposure wavelength and having pitch ratios of near 1:1, extending the $k_{pitch}$ to 0.30. In addition, the method of the present invention also eliminates the problems associated with multiple exposure techniques that require the use of different reticles in the imaging process. As explained in more detail below, the method of the present invention utilizes a single reticle, thereby eliminating such problems, for example, reticle placement errors.

Additional advantages of the present invention will become apparent to those skilled in the art from the following detailed description of exemplary embodiments of the present invention.

Although specific reference may be made in this text to the use of lithographic apparatus and masks in the manufacture of ICs, it should be explicitly understood that such apparatus and masks have many other possible applications. For example, they may be used in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from United States patents U.S. Pat. Nos. 5,296,891 and 5,523,193, which are incorporated herein by reference.

a programmable LCD array. An example of such a construction is given in United States patent U.S. Pat. No. 5,229,872, which is incorporated herein by reference.

The invention itself, together with further objects and advantages, can be better understood by reference to the following detailed description and the accompanying schematic drawings.

BRIEF DESCRIPTION OF THE DRAWINGS

FIGS. 1(a)-1(d) illustrate how the utilization of off-axis illumination techniques allow for reduction in the minimum pitch that can be imaged by a lithography systems.

FIG. 2b illustrates four spatial frequency components of the "brick wall" pattern of FIG. 2a.

FIG. 3 illustrates the diffraction pattern generated by the "brick wall" pattern of FIG. 2a.

FIG. 6a illustrates a Y-dipole exposure setting optimized to pattern the horizontal features of the "brick wall" pattern of FIG. 2a.

FIG. 6b illustrates a simulated aerial image of the "brick wall" pattern utilizing the Y-dipole exposure setting of FIG. 6a.

FIG. 7a illustrates a conventional illumination setting optimized to pattern the vertical features of the "brick wall" pattern of FIG. 2a.

FIG. 7b illustrates a simulated aerial image of the "brick wall" pattern utilizing the conventional illumination setting of FIG. 7a.

FIG. 8 illustrates the resulting aerial image of the "brick wall" pattern utilizing both of the optimized exposures of FIGS. 6a and 7a.

FIG. 9b illustrates seven spatial frequency components of the contact hole pattern of FIG. 9a.

FIG. 10 illustrates the diffraction pattern generated by the contact hole pattern of FIG. 9a.

FIG. 14 illustrates a modified pattern containing the diffraction elements necessary to properly image the contact hole pattern of FIG. 9a.

FIG. 17 illustrates the diffraction orders of the pattern of FIG. 14 captured by a coherency setting of sigma=0.85 and angles of +/−45 degrees.

FIG. 18a illustrates the QUASAR illumination setting optimized to image the columns of the small dense contact holes of the pattern of FIG. 9a.

FIG. 18b illustrates the simulated aerial image of the contact hole pattern utilizing the QUASAR illumination setting of FIG. 18a, in which the setting is 90/60/30, 0.80 NA and 17 mJ.

FIG. 19 illustrates the diffraction orders of the pattern of FIG. 14 captured by a coherency setting of sigma=0.45 along both the x-axis and y-axis.

FIG. 20a illustrates the QUASAR illumination setting optimized to image the larger, less dense contact holes of the pattern of FIG. 9a.

FIG. 20b illustrates the simulated aerial image of the contact hole pattern utilizing the QUASAR illumination setting of FIG. 20a, in which the setting is 60/30/30, 0.80 NA and 14 mJ.

FIG. 21 illustrates the resulting aerial image of the contact hole pattern utilizing both of the optimized exposures of FIGS. 18a and 20a.

DETAILED DESCRIPTION OF THE DRAWINGS

Figure 2A:
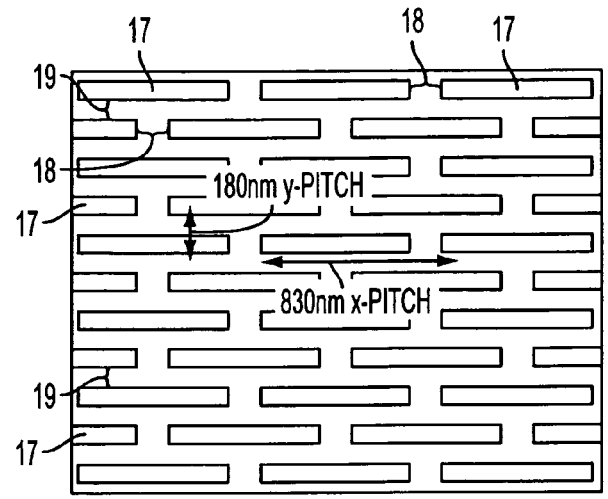
FIG. 2a illustrates an exemplary "brick wall" pattern to be imaged utilizing the method of the present invention.

Prior to discussing the details of the present invention, a brief discussion of the technology involved is provided in order to facilitate the understanding of the novel method of the present invention. Imaging of any particular pattern feature is the result of the lens of an imaging system capturing the light, which is diffracted by an image at the object plane, as the wave front passes by. The resulting diffraction pattern that is created by this object can be relatively simple as would be the case for an infinite series of line/space patterns, or extremely complex in the case of a completely random pattern. Each part of this diffracted light contains information about the image and plays a role in the formation of the image at the image plane. When the imaging lens does not capture portions of the diffracted light, information (elements of the pattern contained within that light) is lost and the image is degraded. The effect is that the imaging lens acts as a low pass spatial frequency filter in optical lithography.

As the best imaging of a particular spatial frequency component of a pattern is done with a specific coherency that matches the spatial frequency of that component, it is desirable to control the illumination conditions in a manner that is optimized for the desired pattern to be imaged. However, it is often the case that the coherency conditions necessary to image each component of the desired pattern are mutually exclusive, and therefore impossible to achieve in a single exposure. Special illuminators have been proposed which control the illumination intensity to achieve this ideal coherency conditions. However this concept of customized illumination only controls the coherency intensity and does not provide a means to control which diffraction orders of a given coherency condition are captured by the lens.

When any pattern is illuminated with a coherent beam of light, it generates a diffraction pattern and the angles at which the light is diffracted is determined by the spatial frequency components of the pattern. A simple example of this is an infinite line/space pattern which has a single spatial frequency defined by the pitch ($P_x$) of the line/space pattern. The coherent light will be diffracted perpendicular to the line/space pattern at angles (or diffraction orders, n) that are defined by the equation:

$$\theta = \sin^{-1}\{(n^*\lambda)/P_x\} \qquad [1]$$

An ideal imaging lens would capture all of the diffracted light and recombine it to form a perfect image of the original line/space pattern. In reality, objective lenses have a finite angle over which they can capture the diffracted beams and any diffracted light beyond this angle is lost. This leads to a degraded reconstruction of the image at the image plane or in the case where none of the diffracted light is captured by the lens, no imaging at all. The angle over which a lens can capture light is determined by the numerical aperture, or the NA, which defines the diameter of the lens.

As such, as illustrated in FIGS. 1(a) and 1(b), if a line/space pattern 11 is illuminated with a coherent beam of light 13 along the optical axis of an imaging system, the minimum pitch ($P_{min}$) that would still allow for the +/−1 diffraction order to be captured by the lens 15 can be expressed by:

$$P_{min} = \lambda/NA \qquad [2]$$

As shown in FIG. 1(a), which illustrates a pattern 11 having a larger pitch, and FIG. 1(b), which illustrates a pattern having a smaller pitch, as the pitch is reduced, it is no longer possible for lens 15 to capture either the +/−1 diffraction order.

However, referring to FIGS. 1(c) and 1(d), if the coherent beam 13 is moved off the optical axis (off axis illumination or OAI) out to the edge of the imaging system, the +1 diffraction order could then be on the optical axis as shown in FIGS. 1(c) and 1(d). In this case, sigma ($\sigma$) approaches a value of 1.0, where $\sigma$ refers to the ratio between the NA of the illumination lens and the NA of the objective (imaging) lens:

$$\sigma = NA_{ill.}/NA_{obj.} \qquad [3]$$

However, under this condition, the −1 diffraction order will now be outside the imaging system and will not be captured by the lens 15. This two-beam imaging allows the pitch to be decreased further until the position of the +1 diffraction order is back at the limit of the lens as shown in FIG. 1(d). In this case, $\sigma$ is defined as $\sigma_{outer}$, and equation [1] is redefined as:

$$P_{min} = \lambda/\{NA^*(1+\sigma_{outer})\} \qquad [4]$$

Beyond this limit, imaging cannot occur because it is not possible to capture both the zero and one (either +1 or −1) diffraction order.

Turning to the present invention, as explained in detail below, the novel method disclosed herein utilizes the foregoing phenomena regarding that only a portion of the diffraction pattern is captured by the objective lens so as to selectively image only those portions of the diffraction pattern that positively contribute to the desired image.

More specifically, as any photomask pattern generates a characteristic diffraction pattern based on the pattern's spatial frequency components, the elements of the diffraction pattern corresponding to the spatial frequency components of the pattern can be collected by a lens system and imaged at the image plane independently and selectively. Further, in accordance with the method of the present invention, patterns which are different, but contain common diffraction elements, are imaged using specific coherency conditions in such a way as to select only the parts of the diffraction pattern that are common to both patterns. As such, it possible for different patterns to be placed in the object plane (reticle patterns) that will create essentially the same image at the image plane.

Accordingly, the method of the present invention utilizes multiple exposures with different exposure and coherency conditions in combination with very high transmission attenuated PSM, such that elements of the diffraction pattern that provide the best imaging of the desired wafer image (or that best define the pattern) can be selected out and exposed independently at exposure energies that are optimized for the pattern components contained in each exposure. By setting the coherency conditions properly during each exposure, unwanted portions of the diffraction pattern can be greatly minimized or eliminated. Further, by combining multiple exposures, the complete image is formed by composite illumination that is optimized for printing the desired pattern and by taking advantage of the non-linear behavior of the photoresist pattern formation. As a result, the method of the present invention makes it possible to image at near 1:1 pitch (e.g., line-to-space ratio) where the pitch is below the exposure wavelength, $\lambda$. Importantly, the method of the present invention utilizes only a single photomask which is exposed two or more times utilizing different coherency exposure settings. As such, the method of the present invention eliminates the problems associated with techniques that require the use of multiple photomasks, such as dipole and complimentary alt-PSM.

As a result, it is possible to create a pattern, which is different from the desired wafer image, but has a diffraction pattern that contains the elements of a desired pattern (as well as additional unwanted pattern information) that when illuminated with the proper coherency conditions, will result in the formation of the desired image. By properly designing the reticle pattern, very strong off-axis illumination techniques such as dipole, can be used with only a single reticle. Acquiring the desired image is accomplished by properly positioning the illuminator (controlling the coherency) in a manner that controls which of the complex diffraction orders are captured by the imaging lens. The method of the present invention will now be described in detail in conjunction with the imaging of two exemplary patterns.

A first exemplary pattern to be imaged utilizing the present invention is a "brick wall" pattern as illustrated in FIG. 2a. Referring to FIG. 2a, the pattern contains features 17, hereinafter referred to as "bricks" and spaces 18 and 19 between the bricks. The spaces 18 between the ends of the bricks 17 represent one type of periodic pattern which can be best imaged by a coherency condition set to optimize the imaging of the spatial frequency that corresponds to these spaces 18. The spaces 19 between the tops and bottoms of the bricks can be best imaged with a different coherency condition set to optimize the imaging of the high spatial frequency component of the brick pattern in the y direction. By separating these two illumination conditions into two separate exposures, light that does not contribute to imaging is minimized. It also allows different exposure energies to be used for the different illumination conditions giving an effect similar to that of a gray-scale custom illuminator.

Figure 2B:
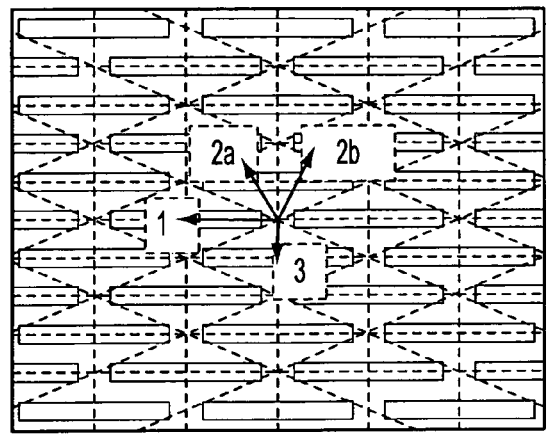

The "brick wall" pattern illustrated in FIG. 2a is typical pattern that is commonly used in the semiconductor fabrication process, mainly for making memory devices. As shown in FIG. 2a, the brick wall pattern is made up of staggered rows of rectangles 17 that can be characterized by the dimension of the rectangle, the distance between rectangles along a row (i.e., x-pitch), and the distance between rows of rectangles (i.e., y-pitch). In the exemplary pattern shown in FIG. 2a, where the dimension of the rectangle is 80 nm by 630 nm, the x-pitch is 830 nm, and the y-pitch is 180 nm. Imaging this pattern with 248 nm KrF exposure wavelength illustrates an example of printing a near 1:1 pattern that has a pitch much less than the exposure wavelength. It is noted that in the pattern of FIG. 2, when taken in the Y-orientation, there is a 1:1 line-to-space ratio as the vertical distance between the features equals the vertical height of the features.

Figure 3:
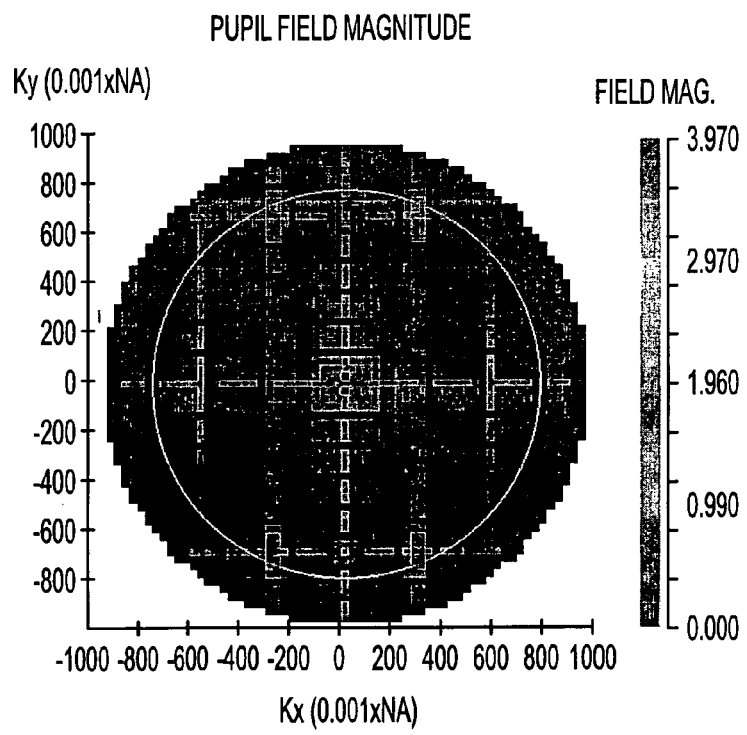

More specifically, when the brick wall pattern of FIG. 2a is illuminated with a coherent beam of electromagnetic energy along the optical axis of an imaging lens with an NA=0.80 and λ=248 nm, it results in a diffraction pattern as shown in FIG. 3. The diffraction pattern of FIG. 3 indicates that the 0.80 NA lens of the stepper captures three spatial frequency components of the brick wall pattern. The two diffraction orders along the x-axis correspond to the +/−1 order of the x-axis spatial frequency of 415 nm (830 nm divided by two because of the staggering of every other row), shown as vector 1 in FIG. 2b. The two diffraction orders in the upper portion of the lens and the two in the lower portion of the lens correspond to the +/−1 diffraction orders of the two spatial frequencies of 330 nm occurring along the corresponding vectors 2a and 2b in FIG. 2b, which are perpendicular to the vectors <415,180> and <415,−180>. It is noted that $P_{min}$ for this condition ($\sigma_{outer}$ approaches 0) calculated from Equation [3] is 310 nm. However, the pattern also has a spatial frequency component of 180 nm in the y direction, which is indicated as vector 3 in FIG. 2b. While it might appear that sufficient diffraction orders to image the pattern were captured in the diffraction pattern illustrated in FIG. 3, the captured diffraction orders lack imaging information for the 180 nm y-pitch component (vector 3) of this pattern. Also, it is noted that the intensities of the various diffraction orders are different.

Figure 4:
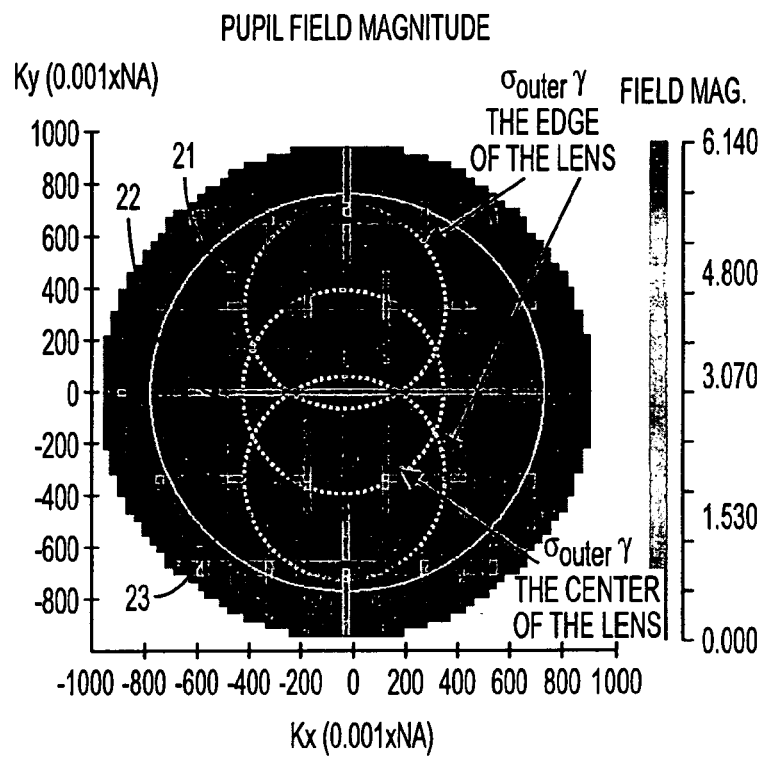
FIG. 4 illustrates the diffraction pattern generated by the "brick wall" pattern of FIG. 2a utilizing an exposure wavelength approximately ½ that of the exposure wavelength utilized to generate the diffraction pattern illustrated in FIG. 3.

In order to obtain a wider view of the diffraction pattern that the brick wall of FIG. 2a generates, the wavelength of the coherent beam utilized in the simulation was changed to 126 nm, or approximately λ/2. Such a reduction in the wavelength of the exposure source reduces all the diffraction angles by half and the resulting diffraction pattern is shown in FIG. 4. Importantly, by studying this diffraction pattern, σ values for a coherent beam can be identified that will result in capturing specific diffraction orders. The three circles 21, 22 and 23 in FIG. 4 represent the diffraction capturing capability of a 0.80 NA lens and 248 nm wavelength. When the coherent beam is placed in the center of the lens (i.e., circle 22), at $\lambda_{outer}$ approaches 0, the center six strong diffraction orders are collected, just as shown in FIG. 3. However when the coherent beam is placed near the bottom edge of the lens in the vertical direction (i.e., circle 23), so that $\sigma_{outer}$=0.90, it is possible to capture the first order diffraction of the 180 nm pitch spatial frequency pattern. However, in this condition, the lens no longer captures any of the diffraction orders along the x-axis. Similarly, the same thing occurs when the beam is placed near the top edge of the lens (i.e., circle 21), only now the −1 diffraction order is captured instead of the +1.

Thus, as clear from the foregoing, depending on where within the illuminator a particular coherent beam is coming from ($\lambda_{outer}$ and angle relative to the optical axis) will determine what, if any of the diffraction orders generated by that point will be collected by the lens. As explained in more detail below, the method of the present invention utilizes the diffraction pattern to determine the optimum exposure and illumination settings for capturing the diffraction orders necessary to faithfully print the desired image.

Figure 5:
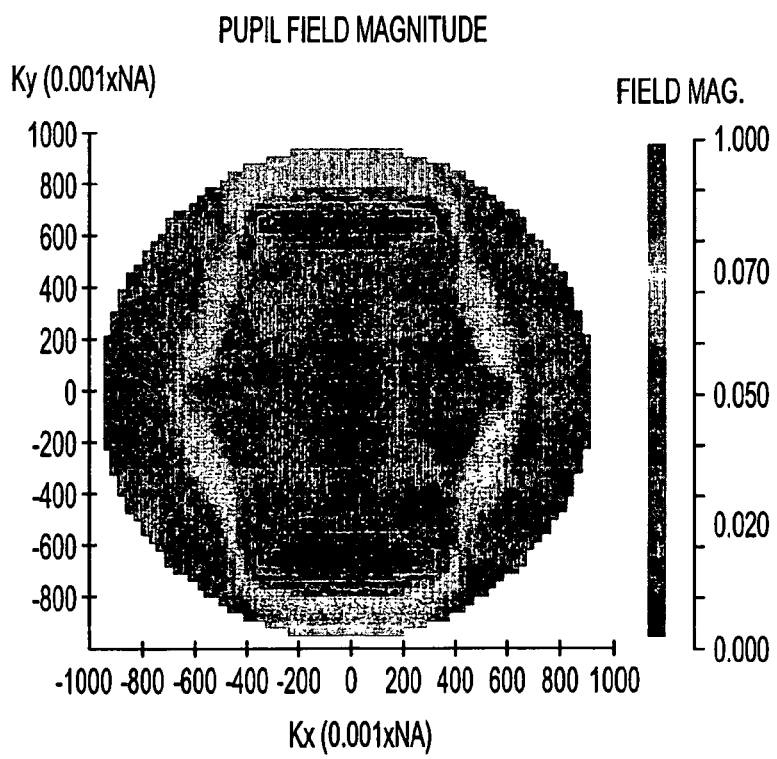
FIG. 5 illustrates the pupil fill pattern corresponding to the diffraction pattern of FIG. 3, which results from an illuminator set to conventional illumination with a sigma equal to 1.0 and an exposure wavelength equal to 248 nm.

FIG. 5 illustrates the pupil fill intensity of a conventional light source with $\sigma_{outer}$ equal to 1.0 and an exposure wavelength of 248 nm. It is noted that the simulated diffraction pattern illustrated in FIG. 4 and the pupil fill intensity plot of FIG. 5 can be generated utilizing a software program called "LithoCruiser" created by ASML MaskTools. The pupil fill intensity plot of FIG. 5 allows for the identification of what areas of the illuminator contribute strongly to the imaging process and which do not. Specifically, areas of higher intensity correspond to coherency conditions where a relatively large amount of the diffracted energy is captured by the imaging system, thus transferring to the imaging plane those spatial frequency components of the pattern that are contained in this captured diffracted energy.

For example, at the edge of the pupil field along the x-axis, the pupil fill intensity is relatively low because there is no high x-axis spatial frequency component in the pattern (the smallest pitch, or highest spatial frequency is 415 nm). Thus, light coming from coherent points in this region does not contribute strongly to the overall image formation of the brick wall pattern. Coherency points near the center of the illumination contribute more strongly to the image formation because both +1 and −1 diffraction orders of the 415 nm x-axis spatial frequency component of the pattern are captured by the lens. Moving out toward the edge in the x direction, a first order diffraction will be lost and there are no additional first order diffraction orders to be gained. Conversely, moving out toward the edge in the y direction results in capturing the very important first order diffraction as the points become near the edge. Thus, the pupil fill intensity is relatively high along the upper and lower edge of the pupil field. Thus, by reviewing the diffraction pattern and the pupil fill intensity plot, it is possible to customize/optimize the illumination pattern so that it matches the pupil fill pattern of the desired printed image.

Figure 6A:
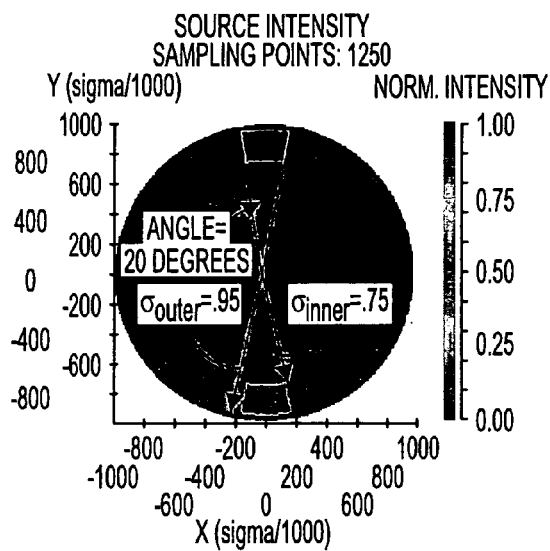
Figure 6B:
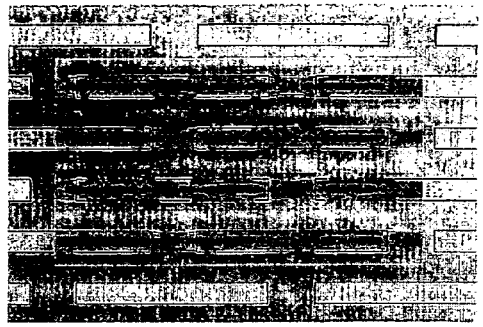

In the current example, based on analysis of the diffraction pattern and pupil fill intensity plot corresponding to the brick wall pattern, it was determined that for a 248 nm exposure wavelength, a y-dipole illumination at a setting of 0.95 outer sigma, 0.75 inner sigma, and an angle of 20 degrees, as shown in FIG. 6(a), is effective for printing the sub-wavelength, 180 nm y-pitch horizontal structure. However, the use of the illumination setting of FIG. 6(a) results in the loss of all of the x-axis spatial frequency components of the pattern because the lens is unable to capture any of the light that is diffracted in the x-axis direction. FIG. 6(b) illustrates the simulated aerial image resulting from printing the brick wall pattern of FIG. 2a using the illumination conditions illustrated in FIG. 6(a) and an exposure dose of 32 mJ and a 0.80 NA. As shown in FIG. 6(b), the structures that have the high y-axis spatial frequency are well defined (i.e., the horizontal lines and spaces). However, there was no imaging of the area between the ends of the rectangular features, which have an x-axis spatial frequency component.

Figure 7A:
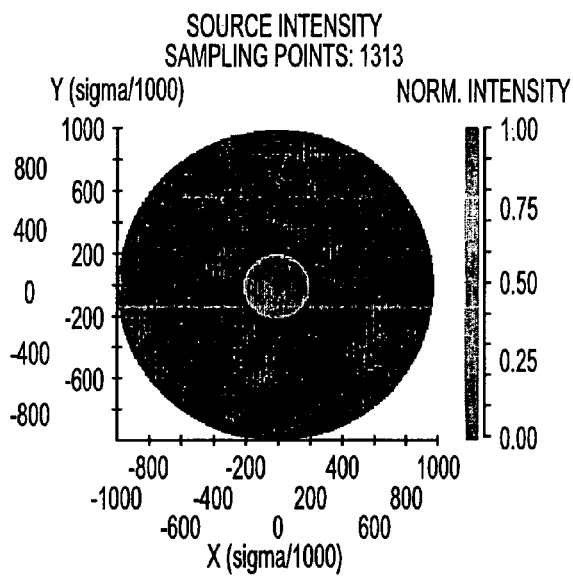
Figure 7B:
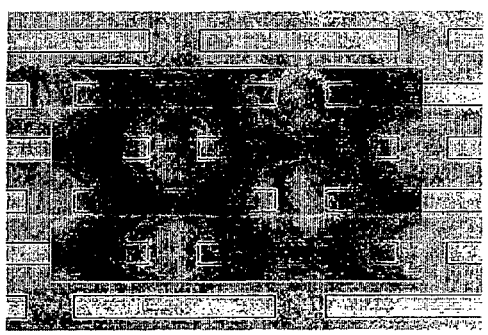

In order to image the lower spatial frequency components of the pattern, it was determined from the diffraction pattern and the pupil fill intensity plot that the optimum coherency condition would be conventional illumination with a very small sigma (in this example sigma=0.20). The specific illumination setting utilized is illustrated in FIG. 7(a). FIG. 7(b) illustrates the simulated aerial image resulting from printing the brick wall pattern of FIG. 2a using the illumination conditions illustrated in FIG. 7(a), with an exposure dose of 10 mJ and a 0.80 NA. As shown in FIG. 7(b), the selected illumination setting results in the imaging of the area between the ends of the rectangular features. It is noted that because of the greater optical efficiency of printing the less dense structures, the exposure energy cannot be maintained at 32 mJ, but should be reduced to 10 mJ.

Figure 8:
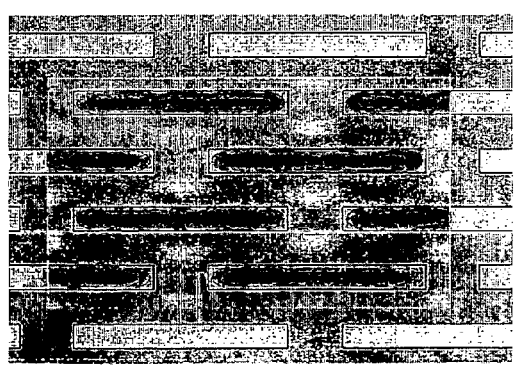

The foregoing makes clear that in the given example, because the intensities of the diffraction orders are different, it is not possible to select a single coherency condition that will result in the capture of all the diffraction orders necessary to reconstruct the desired pattern and expose them utilizing a single exposure. However, by separating the coherency conditions into multiple exposures in accordance with the method of present invention, different exposure energies can be used which will more closely approximate the ideal imaging condition where all the diffracted light is collected. FIG. 8 illustrates the simulation result when the two exposure conditions of FIGS. 6(a) and 7(a) are combined in a multiple exposure method. Specifically, the wafer is first exposed utilizing the illumination conditions of FIG. 6(a) and thereafter, using the same reticle, the wafer is exposed with illumination conditions of FIG. 7(a). As can be seen from the simulation result of FIG. 8, the multiple exposure method of the present invention results in the desired brick wall pattern being imaged on the wafer.

Accordingly, the foregoing method of the present invention allows for the printing of features having a pitch much less than the exposure wavelength and having pitch ratios of near 1:1, thereby extending the $k_{pitch}$ to 0.30. It is noted that the present invention is particularly suitable for use with very high transmission attenuated PSM (e.g., chromeless PSM) due to the strong proximity effects associated with such PSMs. Moreover, the method of the present invention allows for the multiple exposure of the same reticle, thereby eliminating the problems associated with multiple exposure techniques that require multiple reticles to be utilized.

One of the major advantages of the present invention is that it can be applied to dark field imaging, as is the case for printing contact holes. Prior to the present invention, alternating aperture approaches have been utilizes for printing contact holes. However, the nature in which the phase shifting is applied to the design in such alternating aperture approaches, makes it only effective on a very narrow range of contact pitches. Alt-PSM is a resolution enhancement technique that applies to small dark lines, and if the "dark line" between contacts is small enough, resolution is improved. However, when the distance between contacts becomes relatively large, the amount of interference that occurs in the area between the contacts becomes negligible and the resolution enhancement is lost. This approach also suffers from the problem of conflicting phase assignment. As explained below, the present invention provides for a resolution enhancement when utilizing dark field imaging to print contact holes.

Figure 9A:
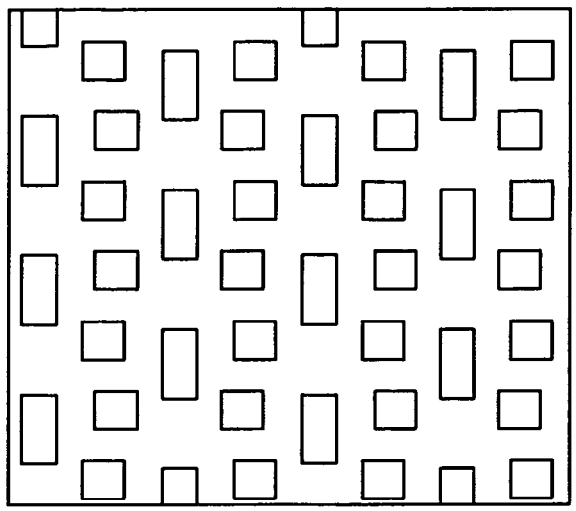
FIG. 9a illustrates an exemplary dark field contact hole pattern to be imaged utilizing the method of the present invention.

FIG. 9a illustrates an example of a dark field contact hole pattern to be printed. This example illustrates two problems with very high transmission attenuated phase shift lithography. The first is that large areas that are intended to be dark are not because of the high transmission of the field area. The second is the near 1:1 pitch ratio results in a dark grating effect, and not in the printing of the desired bright contact holes.

Figure 9B:
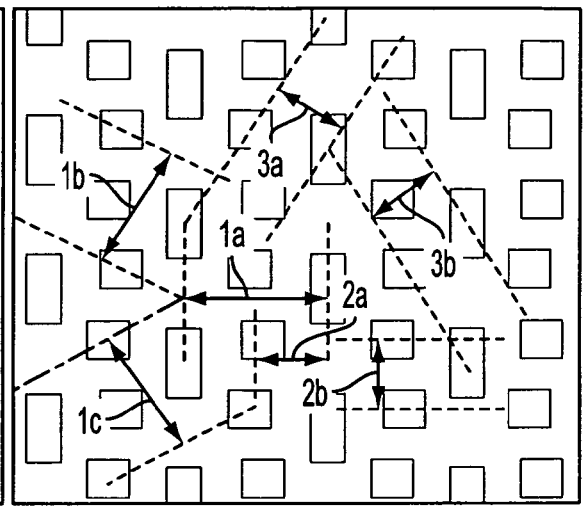
Figure 10:
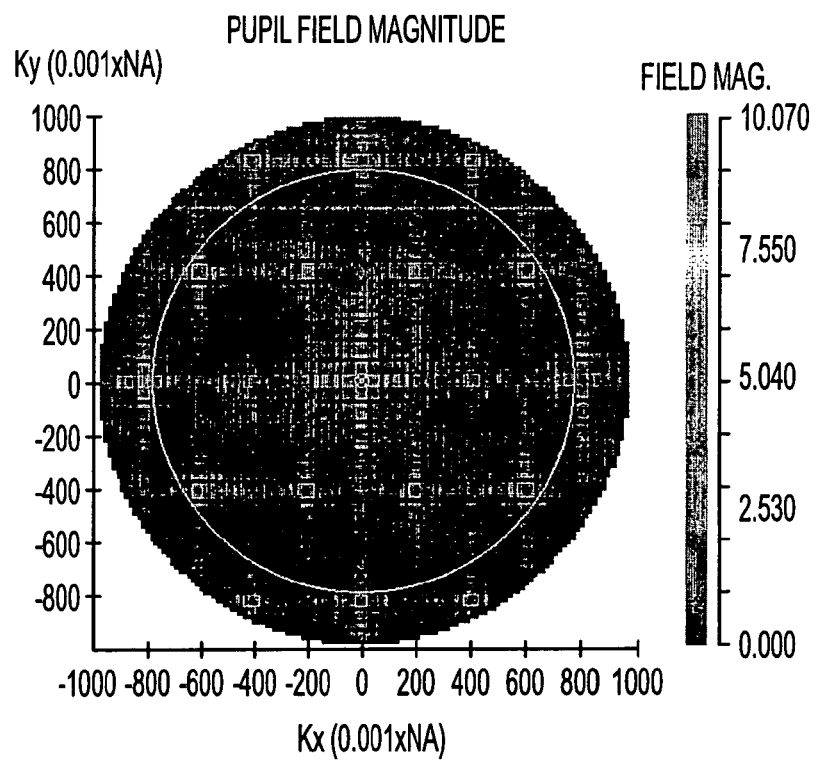
Figure 11:
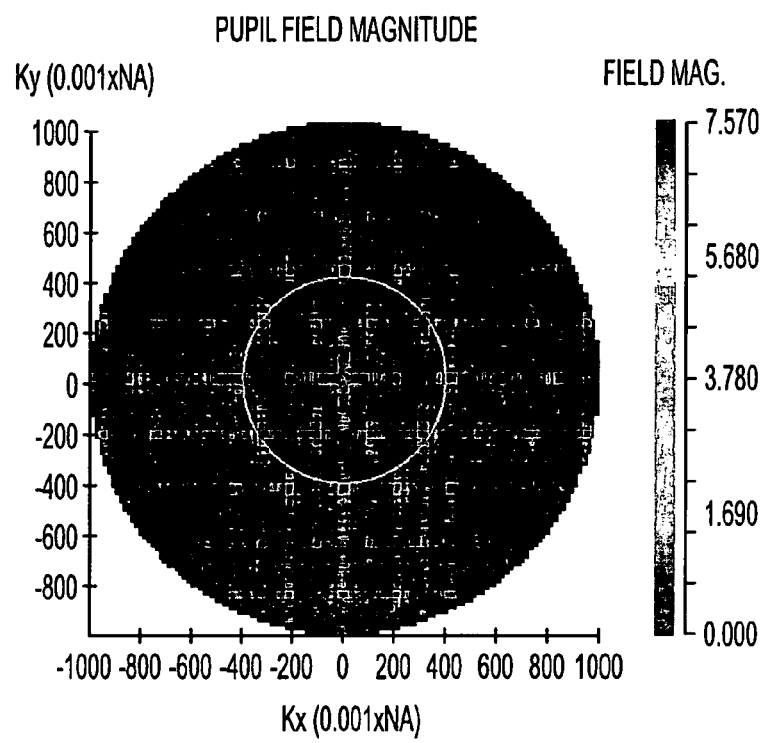
FIG. 11 illustrates the diffraction pattern generated by the contact hole pattern of FIG. 9a utilizing an exposure wavelength approximately ½ that of the exposure wavelength utilized to generate the diffraction pattern illustrated in FIG. 10.
Figure 12:
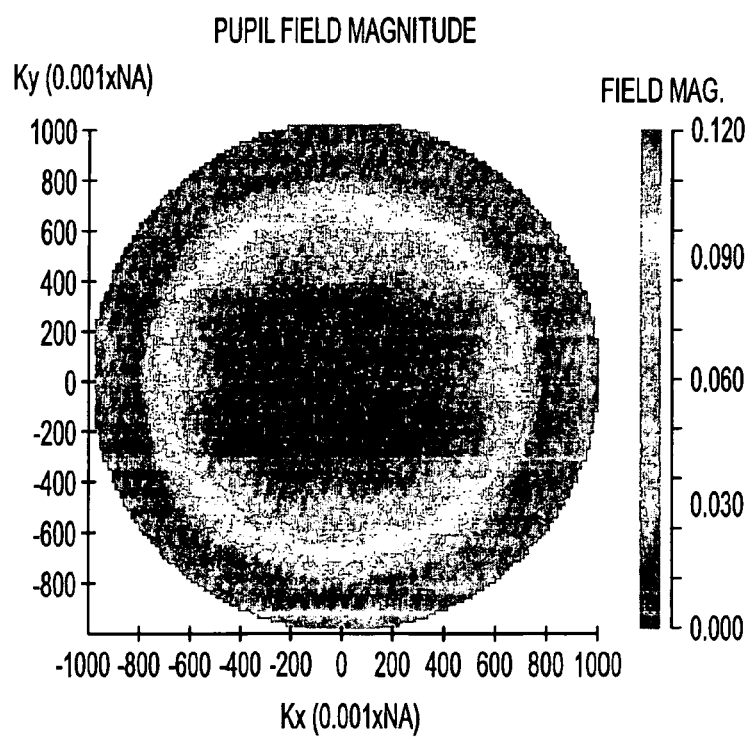
FIG. 12 illustrates the pupil fill pattern corresponding to the diffraction pattern of FIG. 10, which results from an illuminator set to conventional illumination with a sigma equal to 1.0 and an exposure wavelength equal to 248 nm.

FIG. 10 illustrates the diffraction pattern that is generated by the pattern of FIG. 9a when illuminated with a 248 nm coherent beam and the diffraction orders captured by a 0.80 NA lens. Following the same methodology as detailed above in the "brick wall" example, the wavelength utilized in the simulation to produce the diffraction pattern illustrated in FIG. 10 was reduced to 126 nm so as to obtain a wider view of the diffraction pattern. FIG. 11 illustrates the diffraction pattern generated with the 126 nm coherent beam and the 0.80 NA lens. As clear from FIG. 11, the diffraction pattern for the contact hole pattern is much more complex than in the previous example of the brick wall, and as a result, it is more difficult to identify the specific spatial frequency components of the pattern. However, an examination indicates that the six diffraction orders closest to the center correspond to spatial frequencies 1a (600 nm), 1b (536 nm) and 1c (536 nm) as shown in FIG. 9b. The four diffraction orders that are along the x-axis and the y-axis and are just outside the 0.80 NA lens correspond to spatial frequencies 2a (300 nm) and 2b (300 nm) as shown in FIG. 9b. The four diffraction orders that are just inside the 0.80 NA lens at approximately +/−30 degrees from the x-axis correspond to the spatial frequencies 3a (333 nm) and 3b (333 nm) as shown in FIG. 9b. FIG. 12 illustrates the pupil fill pattern corresponding to the diffraction pattern of FIG. 10, which results from an illuminator set to conventional illumination with a sigma equal to 1.0 and an exposure wavelength equal to 248 nm.

Figure 13A:
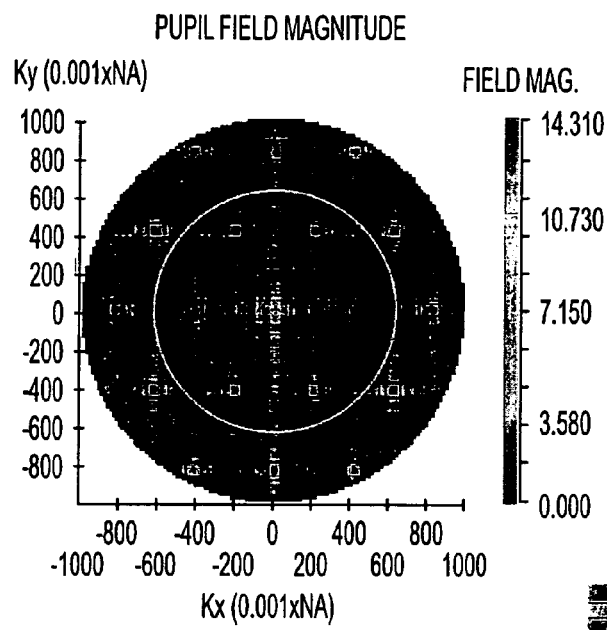
FIG. 13a illustrates the diffraction orders of the contact hole pattern of FIG. 9a captured by a 248 nm wave with a NA=0.60.
Figure 13B:
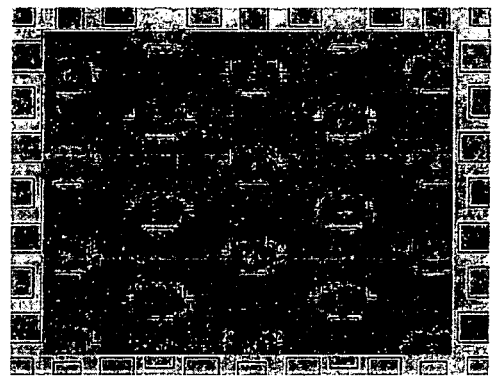
FIG. 13b illustrates the aerial image of the contact hole pattern of FIG. 9a that results from capturing the center six diffraction orders of the contact hole pattern.

Next, the diffraction pattern and the pupil fill pattern are analyzed, by for example empirical methods, and coherency conditions are identified that optimize the imaging of particular elements of the pattern. For example, if the NA of the lens is reduced so that only the diffraction orders related to vectors 1a, 1b and 1c of FIG. 9b are captured by the lens, it can be observed what component of the image is contain within them. FIG. 13a illustrates that when the NA is set for 0.60 at 248 nm exposure, only the center six diffraction orders of the coherent beam are captured by the lens. FIG. 13b illustrates the resulting aerial image simulation for the coherency condition of FIG. 13a, and a 100% transmission chrome-less phase-shifted pattern. From this simulation, it can be seen that both the problem of near 1:1 features printing as dark regions and relatively large field areas image as clear areas instead of dark are occurring. Accordingly, by this analysis, the engineer can conclude that this portion of the overall diffraction pattern contributes undesirable elements to the imaging, namely, putting light intensity in the large field area which is surrounded by the actual contact holes and not in the contact hole patterns where it is needed. This is an undesirable condition and illustrates the need to modify the diffraction pattern by changing the reticle pattern to enable the proper imaging of large field areas and near 1:1 pitch ratios on chrome-less phase shifting reticles.

Figure 14:
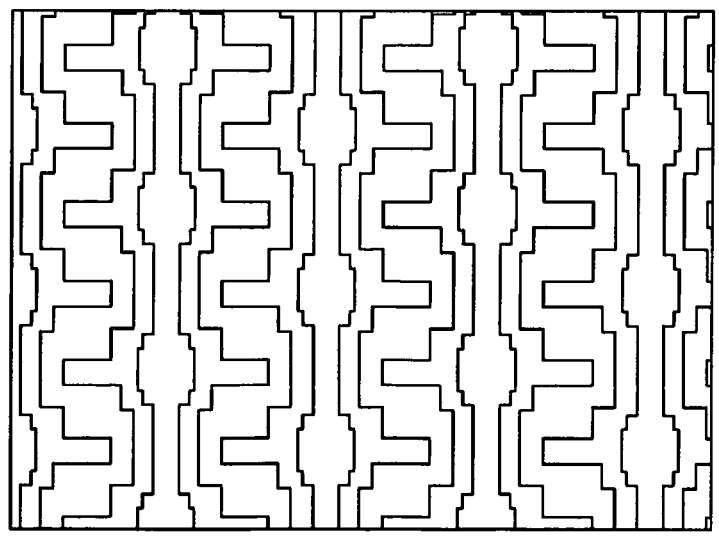
Figure 15:
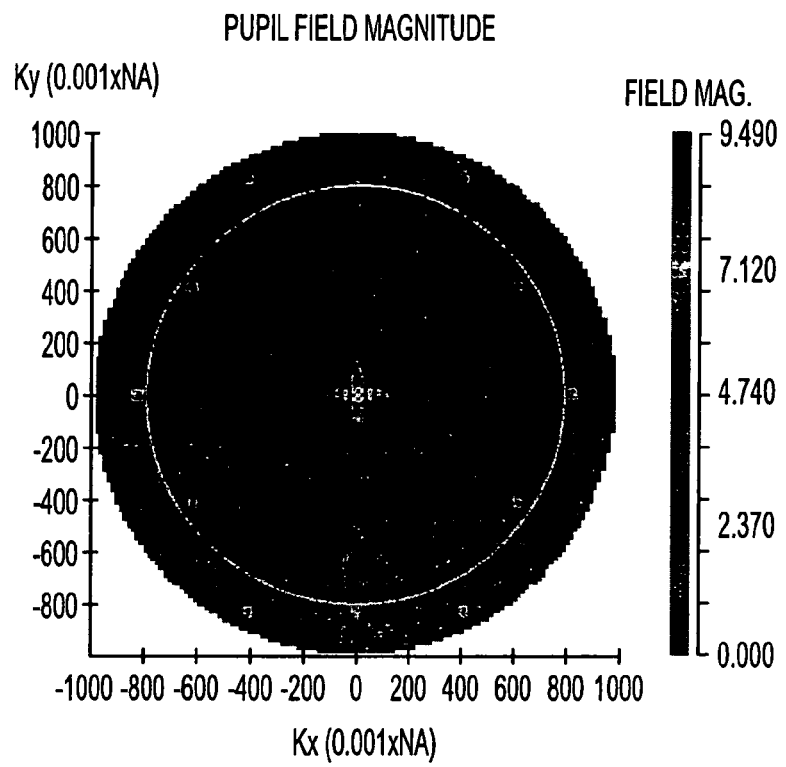
FIG. 15 illustrates the diffraction pattern generated by the pattern of FIG. 14.

There are at least two possible approaches to prevent this portion of the diffraction pattern from contributing to the image formation at the wafer plane. One is to use a chrome pattern in this area to block the exposure energy that is being transmitted through the reticle in this area. The second one, which is used in this example, is to modify the reticle pattern in such a way as to engineer out this portion of the diffraction pattern. Such a modification of the diffraction pattern can be performed, for example, utilizing empirical methods. FIG. 14 shows and example of a pattern that has as part of its complex diffraction pattern, the diffraction elements that are necessary to create the contact hole image of FIG. 9. FIG. 15 illustrates the diffraction pattern for a 248 nm coherent beam generated by the pattern of FIG. 14. As is clear from FIG. 15, the undesirable diffraction elements of the pattern have been eliminated, while at the same time maintaining the outer diffraction orders that are necessary to construct the contact hole pattern from specific coherency conditions.

Figure 16:
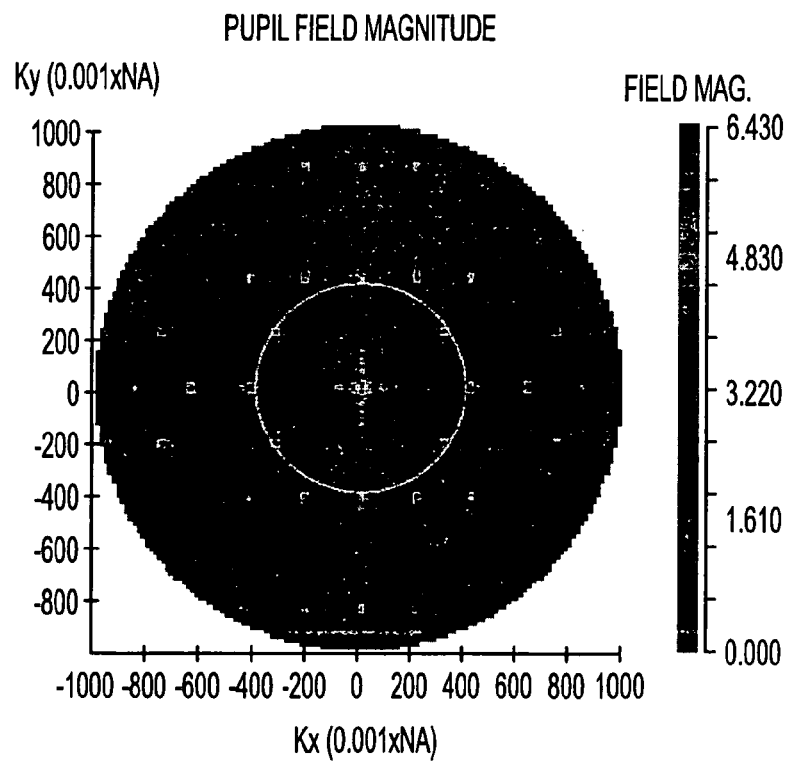
FIG. 16 illustrates the diffraction pattern generated by the pattern of FIG. 14 utilizing an exposure wavelength approximately ½ that of the exposure wavelength utilized to generate the diffraction pattern illustrated in FIG. 15.

In order to properly select the coherency conditions for exposures necessary to image the desired contact pattern, in the same manner as set forth above, the wavelength utilized in the simulation to produce the diffraction pattern illustrated in FIG. 15 was reduced to 126 nm so as to obtain a wider view of the diffraction pattern. FIG. 16 illustrates the diffraction pattern generated with the 126 nm coherent beam and the 0.80 NA lens. Upon review of FIG. 16 it can be determined what the optimal coherency conditions are for each of the components of the pattern. For example, by setting the coherency condition so that sources of illumination are centered at a sigma of 0.80 and at angles of +/−45 degrees from the x-axis (equivalent to QUASAR illumination) as shown in FIG. 18a, the high spatial frequency diffraction orders can be captured by the imaging system as shown in FIG. 17. This particular coherency setting is used to enhance the imaging of the columns of small closely spaced contacts at the cost of the lower spatial frequency rectangular contacts which are poorly imaged utilizing such a setting. FIG. 18b illustrates the simulation results using QUASAR illumination at a setting of 90/60/30, 0.80 NA, and 17 mJ exposure dose (i.e., the illumination setting of FIG. 18a).

In order to image the rectangular contact holes, it was determined that the diffraction orders that contribute strongly to the imaging of these features are best captured using a QUASAR illumination that is rotated by 45 degrees so that the illumination area is centered on the x and y axis, as shown in FIG. 20a. Specifically, the coherency condition was centered at a σ of 0.45 so that diffraction orders that do not contribute to the imaging of the low spatial frequency rectangular contact holes are not captured by the imaging system, as shown in the diffraction pattern of FIG. 19. FIG. 20b illustrates the simulation results using the rotated QUASAR illumination setting of 60/30/30, 0.80 NA, and 14 mJ exposure dose (i.e., the illumination setting of FIG. 20a).

Figure 21:
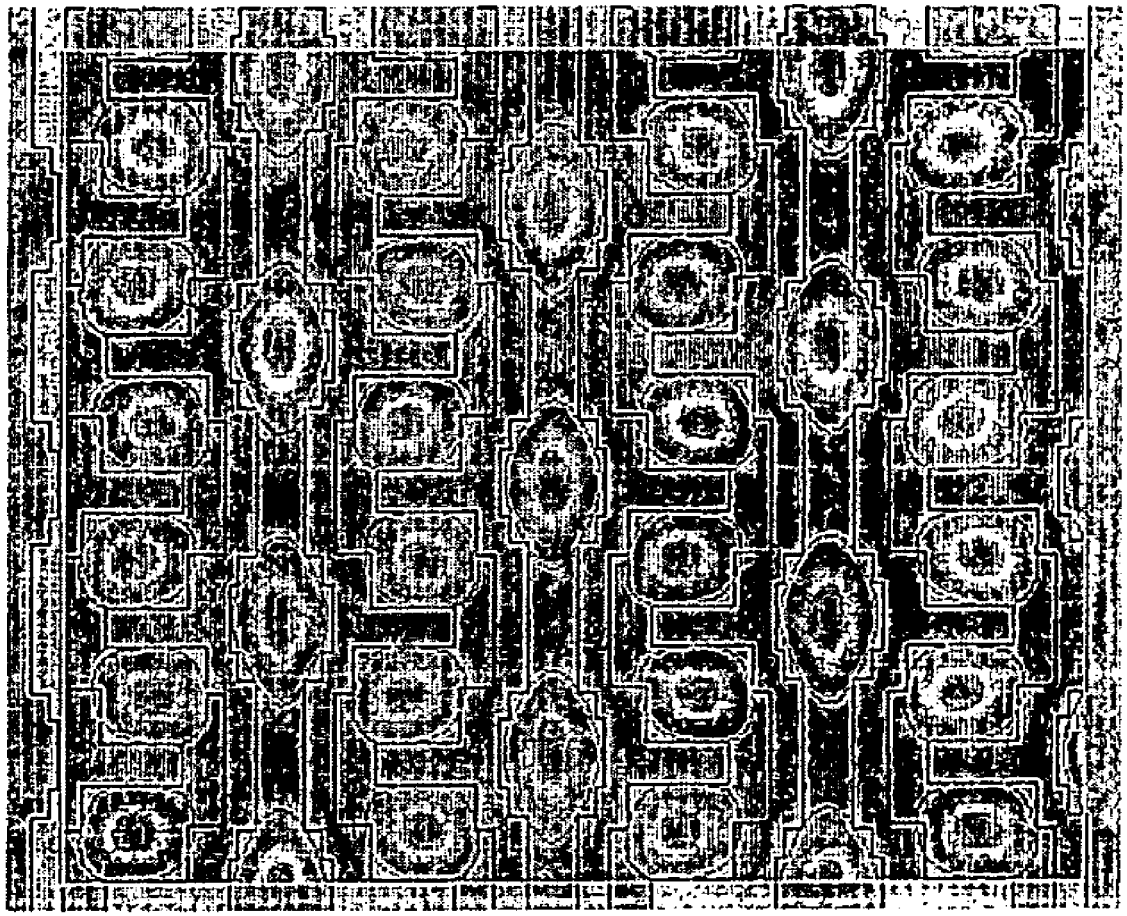

Finally, FIG. 21 illustrates the simulation results when the two exposures (i.e., illumination settings of FIGS. 18a and 20a) are combined. As can been seen, the desired contact hole pattern is faithfully reproduced.

As is clear from the foregoing, the present invention provides significant advantages over the prior art. Most importantly, the novel method of the present invention provides for optical extension using very high transmission attenuated PSM, novel illumination, innovative exposure techniques, and engineering of the diffraction pattern, so as to allow for an enhancement of pitch resolution capability. The method of the present invention enables the printing of features having a pitch much less than the exposure wavelength and having pitch ratios of near 1:1, extending the $k_{pitch}$ to 0.30. In addition, the method of the present invention also eliminates the problems associated with multiple exposure techniques that require the use of different reticles in the imaging process. As explained in more detail below, the method of the present invention utilizes a single reticle, thereby eliminating such problems, for example, reticle placement errors.

Figure 22:
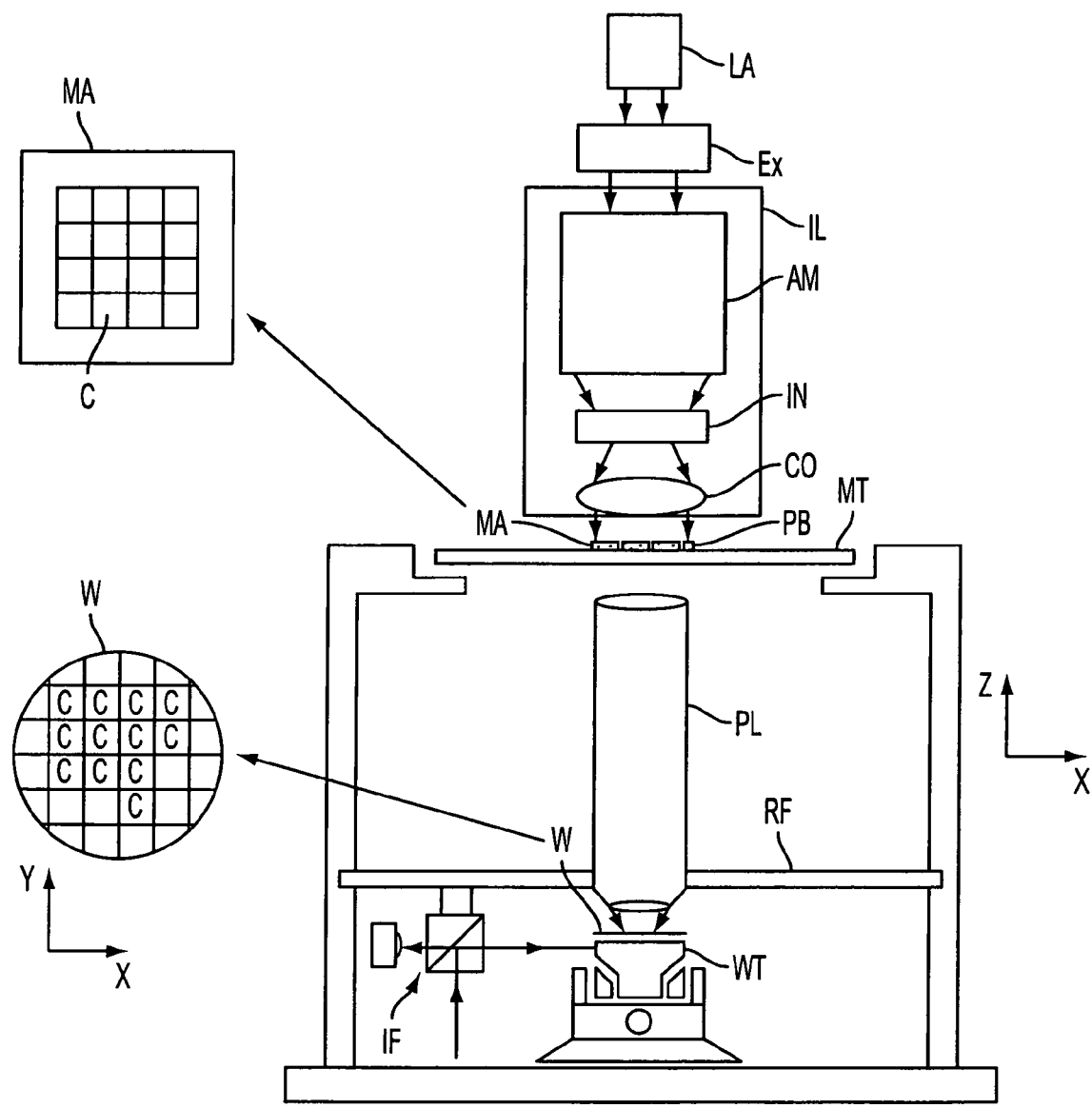
FIG. 22 schematically depicts a lithographic projection apparatus suitable for use with the current invention.

FIG. 22 schematically depicts a lithographic projection apparatus suitable for use with the method of the present invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 22 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 20. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A computer program product for controlling a computer comprising a recording medium readable by the computer, means recorded on the recording medium for directing the computer to perform a method for optically transferring a lithographic pattern corresponding to an integrated circuit utilizing a high transmission attenuated phase-shift mask onto a semiconductor substrate by use of an optical exposure tool, the method comprising the steps of:
    generating a diffraction pattern corresponding to said lithographic pattern, said diffraction pattern indicating a plurality of spatial frequency components corresponding to said lithographic pattern;
    determining which of said spatial frequency components need to be captured by a lens in said optical exposure tool in order to accurately reproduce said lithographic pattern;
    determining a set of illumination conditions required for said optical exposure tool to capture said spatial frequency components necessary for accurately reproducing said lithographic pattern; and
    illuminating said high transmission attenuated phase-shift mask with said set of said illumination conditions.

2. The computer program product according to claim 1, wherein said high transmission attenuated phase-shift mask is a 100% transmission attenuated phase-shift mask.

3. The computer program product according to claim 2, wherein said set of illumination conditions comprises a plurality of distinct illumination conditions, said high transmission attenuated phase-shift mask being illuminated per each distinct illumination condition.

4. The computer program product according to claim 3, wherein each of said distinct illumination conditions includes a different coherency exposure setting.

5. The computer program product according to claim 2, wherein said optical exposure tool utilizes off-axis illumination.

6. The computer program product according to claim 2, wherein said transfer method further comprises the steps of:
    analyzing said diffraction pattern so as to identify spatial frequency components that detract from the accuracy of the lithographic pattern transferred to said semiconductor substrate; and
    determining said illumination conditions necessary to prevent said spatial frequency components that detract from the accuracy of the lithographic pattern from being captured by said optical exposure tool.

7. The computer program product according to claim 2, wherein said transfer method further comprises the step of modifying the diffraction pattern so as to eliminate spatial frequency components, which negatively effect the accurate reproduction of said lithographic pattern.

8. The computer program product according to claim 2, wherein said transfer method further comprises the step of blocking the exposure energy associated with at least one spatial frequency component, which negatively effects the accurate reproduction of said lithographic pattern, so as to prevent said spatial frequency component from reaching said substrate.

9. A computer program product for controlling a computer comprising a recording medium readable by the computer, means recorded on the recording medium for directing the computer to perform a method of optically transferring a lithographic pattern corresponding to an integrated circuit onto a semiconductor substrate by use of an optical exposure tool, said method comprising the steps of:
    generating a diffraction pattern corresponding to the lithographic pattern to be imaged, said diffraction pattern indicating a plurality of spatial frequency components corresponding to said lithographic pattern;
    determining which of said spatial frequency components need to be captured by a lens in an optical exposure tool in order to accurately reproduce said lithographic pattern; and
    forming a high transmission attenuated phase-shift reticle having a pattern which allows said spatial frequency components to be captured to be imaged on a substrate.

10. The computer program product according to claim 9, wherein said reticle blocks exposure energy associated with at least one spatial frequency component, which negatively effects the accurate reproduction of said lithographic pattern, so as to prevent said spatial frequency component from reaching said substrate.

* * * * *